US006960960B2

(12) United States Patent
Ishiwaki

(10) Patent No.: US 6,960,960 B2
(45) Date of Patent: Nov. 1, 2005

(54) FREQUENCY DETECTOR DETECTING VARIATION IN FREQUENCY DIFFERENCE BETWEEN DATA SIGNAL AND CLOCK SIGNAL

(75) Inventor: Masahiko Ishiwaki, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 19 days.

(21) Appl. No.: 10/442,987

(22) Filed: May 22, 2003

(65) Prior Publication Data

US 2004/0124929 A1 Jul. 1, 2004

(30) Foreign Application Priority Data

Dec. 27, 2002 (JP) .............................. 2002-380007

(51) Int. Cl.[7] .............................................. H03L 7/00

(52) U.S. Cl. ...................... 331/1 R; 331/1 A; 331/25; 327/159; 327/43; 327/12; 375/376

(58) Field of Search .......................... 331/1 A, 25, 1 R; 327/159, 12, 43; 375/375, 376

(56) References Cited

U.S. PATENT DOCUMENTS 6,055,286 A * 4/2000 Wu et al. .................... 375/375
6,366,135 B1 * 4/2002 Dalmia et al. ................ 327/12

FOREIGN PATENT DOCUMENTS

JP 11-308097 11/1999

OTHER PUBLICATIONS

"WA 20.5 A 1Gb/s CMOS Clock and Data Recovery Circuit", Hui Wang et al., ISSCC Digest of Technical Papers, Feb. 1999.

* cited by examiner

Primary Examiner—Arnold Kinkead
(74) Attorney, Agent, or Firm—McDermott Will & Emery LLP

(57) ABSTRACT

A reference clock signal or a clock signal delayed in phase from the clock signal by $\pi/2$ is input to D input terminal of a flip-flop circuit. An FSM receives signals input to the flip-flop circuits and signals which have been held by the flip-flop circuits, and outputs an up signal and a down signal. The flip-flop circuits and the FSM operate in synchronization only with a rising edge of a data signal.

10 Claims, 9 Drawing Sheets

FIG.2

| | FSM INPUT | | | | | FSM OUTPUT | | |
|---|---|---|---|---|---|---|---|---|
| | PRE-SIGNAL | | | CURRENT SIGNAL | | | | |
| | QUADRANT | i0 | q0 | QUADRANT | i1 | q1 | u | d | DETERMINATION |
| (1) | I | 0 | 1 | I | 0 | 1 | 0 | 0 | RESET |
| (2) | I | 0 | 1 | II | 0 | 0 | 0 | 1 | DOWN |
| (3) | I | 0 | 1 | III | 1 | 0 | 0 | 0 | RESET |
| (4) | I | 0 | 1 | IV | 1 | 1 | 0 | 0 | RESET |
| (5) | II | 0 | 0 | I | 0 | 1 | 0 | 0 | RESET |
| (6) | II | 0 | 0 | II | 0 | 0 | u | d | — |
| (7) | II | 0 | 0 | III | 1 | 0 | 0 | 1 | DOWN |
| (8) | II | 0 | 0 | IV | 1 | 1 | 0 | 0 | RESET |
| (9) | III | 1 | 0 | I | 0 | 1 | 0 | 0 | RESET |
| (10) | III | 1 | 0 | II | 0 | 0 | 1 | 0 | UP |
| (11) | III | 1 | 0 | III | 1 | 0 | u | d | — |
| (12) | III | 1 | 0 | IV | 1 | 1 | 0 | 0 | RESET |
| (13) | IV | 1 | 1 | I | 0 | 1 | 0 | 0 | RESET |
| (14) | IV | 1 | 1 | II | 0 | 0 | 0 | 0 | RESET |
| (15) | IV | 1 | 1 | III | 1 | 0 | 1 | 0 | UP |
| (16) | IV | 1 | 1 | IV | 1 | 1 | 0 | 0 | RESET |

FREQUENCY DETECTOR DETECTING VARIATION IN FREQUENCY DIFFERENCE BETWEEN DATA SIGNAL AND CLOCK SIGNAL

BACKGROUND OF THE INVENTION

1. Field of the Invention

The present invention relates to a frequency detector. More particularly, the present invention relates to a frequency detector detecting a variation in frequency difference between a data signal and a clock signal.

2. Description of the Background Art

A conventional frequency detector samples a clock signal by using both rise and fall of a data signal. An example thereof is a frequency detector described in "WA 20.5, A 1 Gb/s CMOS Clock and Data Recovery Circuit" (referred to as "WA 20.5" hereinafter) by Hui Wang et al., IEEE International Solid-State Circuits Conference, 1999 (ISSCC 1999).

The conventional frequency detector could make an erroneous determination as to how a frequency of a data signal increases or decreases with respect to a frequency of a clock signal, when a duty ratio of the data signal is corrupted or when the data signal successively has the same value. Here, "a duty ratio of a data signal is corrupted" means that a ratio (a duty ratio) of a remainder obtained from a division of a time of an H level data signal by a data cycle to a remainder obtained from a division of a time of an L level data signal by a data cycle is not 1 to 1.

SUMMARY OF THE INVENTION

An object of the present invention is to provide a frequency detector making no erroneous determination even when a data signal deviates from a normal state.

A frequency detector detecting a variation in frequency difference between a data signal and a clock signal in accordance with one aspect of the present invention includes a first flip-flop circuit receiving the clock signal in synchronization with either a rising edge or a falling edge of the data signal, a second flip-flop circuit receiving a second clock signal 90 degrees out of phase with the clock signal in synchronization with the first flip-flop circuit, and a frequency difference detection unit detecting a variation in frequency difference between the data signal and the clock signal based on the clock signal, the second clock signal, and data held by the first and second flip-flop circuits, and providing outputs of first and second control signals indicating an increase or a decrease in frequency of the clock signal depending on a result of the detection.

In accordance with another aspect of the present invention, a frequency detector detecting a variation in frequency difference between a data signal and a clock signal includes a first flip-flop circuit receiving the clock signal in synchronization with a rising edge and a falling edge of the data signal, a second flip-flop circuit receiving a second clock signal 90 degrees out of phase with the clock signal in synchronization with the first flip-flop circuit, a frequency difference detection unit detecting a variation in frequency difference between the data signal and the clock signal based on the clock signal, the second clock signal, and data held by the first and second flip-flop circuits, and providing outputs of first and second control signals indicating an increase or a decrease in frequency of the clock signal depending on a result of the detection, a detection unit of identical value in succession providing an output of an inhibit signal when the data signal has an identical value repeated at least a prescribed number of times, a first AND gate receiving inputs of the first control signal and the inhibit signal, and a second AND gate receiving inputs of the second control signal and the inhibit signal.

Accordingly, in accordance with the present invention, it is possible to prevent an erroneous determination of a frequency difference that could be caused by the data signal deviating from a normal state.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 shows a truth table representing a relation between an input and an output to/from an FSM 3.

FIG. 7 is a block diagram illustrating a configuration of an UP/DN mask device 6a.

DESCRIPTION OF THE PREFERRED EMBODIMENTS

Figure 1:
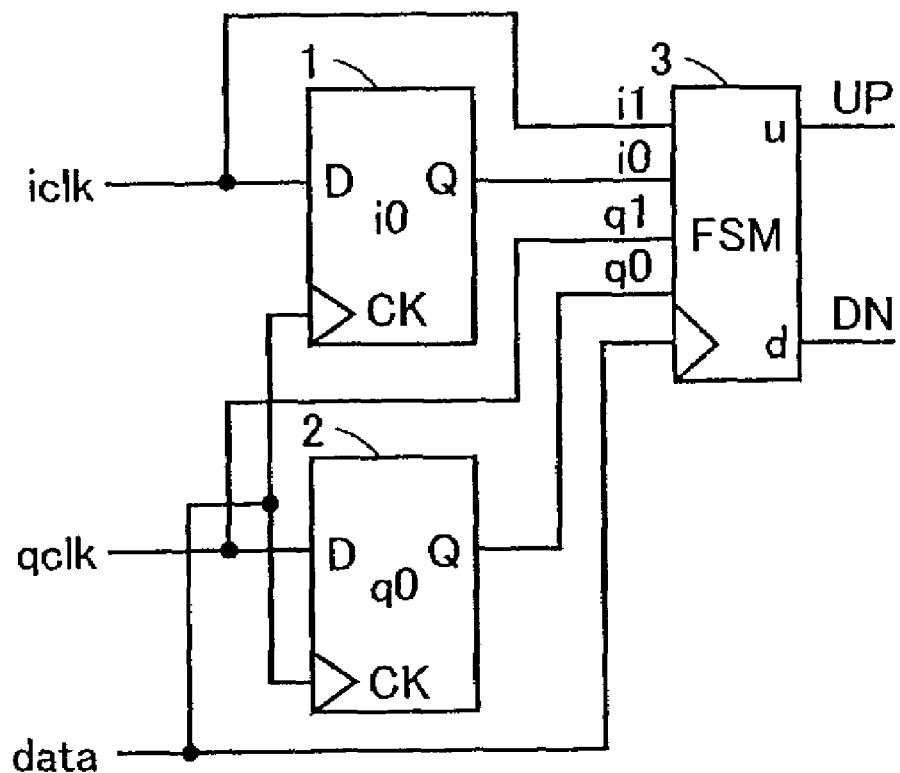
FIG. 1 is a block diagram illustrating a configuration of a frequency detector 100 in accordance with a first embodiment of the present invention.

In the following, embodiments of the present invention will be described in detail with reference to the drawings. The same reference numerals will be assigned to the same or corresponding portions in the drawings, and a description thereof will not be repeated.

A frequency detector in accordance with the present invention described in each embodiment in the following corresponds to an FD (Frequency Detector) in a CDR (Clock and Data Recovery) architecture described in FIG. 20.5.1 in WA 20.5.

First Embodiment

FIG. 1 is a block diagram illustrating a configuration of a frequency detector 100 in accordance with a first embodiment of the present invention.

Frequency detector 100 in FIG. 1 in accordance with the first embodiment includes flip-flop circuits 1, 2, and a finite state machine (referred to as an FSM hereinafter) 3. FSM 3 includes a flip-flop circuit for holding a state. The flip-flop circuits in the present invention are all data flip-flop circuits and include D input terminals, CK input terminals, and Q output terminals. An input signal D input from D input terminal synchronizes only with a rising edge of an input signal from CK input terminal and provides an output identical to input signal D to Q output terminal.

A reference clock signal iclk and a clock signal qclk delayed in phase from clock signal iclk by $\pi/2$ are input to D input terminals of flip-flop circuits 1 and 2, respectively. A data signal "data" is input to CK input terminals of flip-flop circuits 1 and 2. Flip-flop circuits 1 and 2 operate in synchronization only with a rising edge of this data signal data.

FSM 3 receives signals i1 and q1 input to flip-flop circuits 1 and 2 and signals i0 and q0 which have been held by flip-flop circuits 1 and 2, and then outputs an up signal UP (an output signal u) and a down signal DN (an output signal d). FSM 3 also operates in synchronization only with the rising edge of data signal data.

FIG. 2 shows a truth table representing a relation between an input and an output to/from FSM 3.

As shown in FIG. 2, (i0, q0)=(0, 1), (0, 0), (1, 0), (1, 1) correspond to quadrants I, II, III, IV, respectively. The same is true for (i1, q1). Outputs (u, d) from FSM 3 are determined by a combination of quadrants each defined by these (i0, q0) and (i1, q1).

As shown in (2) of FIG. 2, when a quadrant defined by (i0, q0) is I and a quadrant defined by (i1, q1) is II, outputs (u, d) from FSM 3 are (0, 1). Consequently, FSM 3 determines that the output signal is a down. As shown in (7) of FIG. 2, the same is true for the case in which a quadrant defined by (i0, q0) is II and a quadrant defined by (i1, q1) is III. Here, a determination of "down" means that frequencies of clock signals iclk and qclk are to be decreased because the frequencies of clock signals iclk and qclk relative to data signal data are relatively higher (faster) than in the last determination.

As shown in (10) of FIG. 2, when a quadrant defined by (i0, q0) is III and a quadrant defined by (i1, q1) is II, outputs (u, d) from FSM 3 are (1, 0). Consequently, FSM 3 determines that the output signal is an up. As shown in (15) of FIG. 2, the same is true for the case in which a quadrant defined by (i0, q0) is IV and a quadrant defined by (i1, q1) is III. Here, a determination of "up" means that the frequencies of clock signals iclk and qclk are to be increased because the frequencies of clock signals iclk and qclk relative to data signal data are relatively lower (slower) than in the last determination.

As shown in (6) of FIG. 2, when quadrants defined by (i0, q0) and (i1, q1) are both II, outputs (u, d) from FSM 3 remain the same as in the last determination. As shown in (11) of FIG. 2, the same is true for the case in which quadrants defined by (i0, q0) and (i1, q1) are both III.

When a combination of quadrants each defined by (i0, q0) and (i1, q1) is anything other than the combinations described above, outputs (u, d) from FSM 3 are (0, 0). Consequently, FSM 3 determines that the output signal is a reset. Here, a determination of "reset" means a cancellation of the determinations that the frequencies of clock signals iclk and qclk are to be increased or decreased.

As described above, FSM 3 performs a comparison test on the frequency difference between the data signal and the clock signal depending on the combinations of quadrants shown in FIG. 2.

Figure 3:
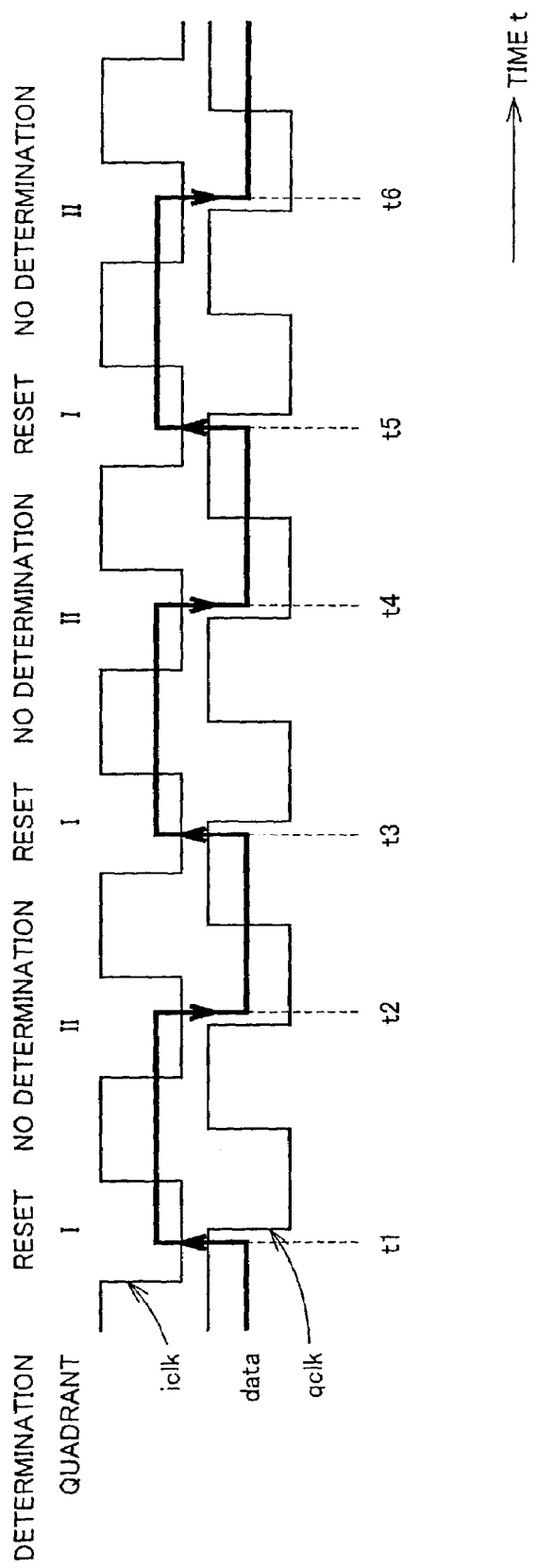
FIG. 3 is a timing diagram representing an operation of frequency detector 100 in FIG. 1.

FIG. 3 is a timing diagram representing an operation of frequency detector 100 in FIG. 1.

At time t1, t3, and t5, data signal data rises, and a comparison test on the frequency difference between the data signal and the dock signal is performed. At time t1, t3, and t5, as input (i1, q1) is (0, 1) ((i1, q1)=(0, 1)), frequency detector 100 determines that the output signal is a reset, regardless of a state of (i0, q0).

At time t2, t4, and t6, data signal data falls. At this time, frequency detector 100 does not perform any comparison test on the frequency difference.

On the other hand, in the conventional frequency detector, even at time t2, t4, and t6 when data signal data falls, a comparison test on a frequency difference is performed. At time t2, t4, and t6, as input (i0, q0) is (0, 1) and input (i1, q1) is (0, 0) ((i0, q0)=(0, 1) and (i1, q1)=(0, 0)), the conventional frequency detector determines that the output signal is a down.

In reality, however, data signal data in FIG. 3 simply has a corrupted duty ratio. The frequency difference between the data signal and the clock signal has not changed on average. Thus, when the data signal has a corrupted duty ratio as in FIG. 3, the conventional frequency detector makes an erroneous determination.

On the contrary, in frequency detector 100 in accordance with the present invention, no comparison test on a frequency difference is performed at time t2, t4, and t6 when data signal data falls. Therefore, the erroneous determination caused by the corrupted duty ratio can be prevented.

Figure 4:
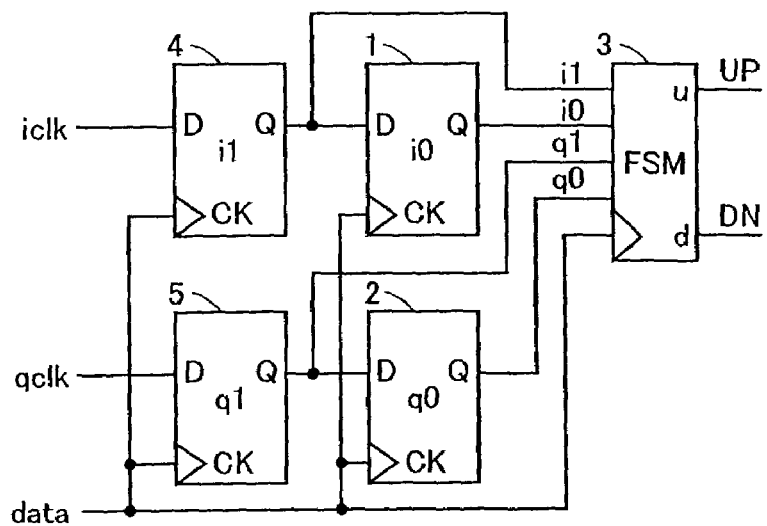
FIG. 4 is a block diagram illustrating a configuration of a frequency detector 101 which is a modification of frequency detector 100.

FIG. 4 is a block diagram illustrating a configuration of a frequency detector 101 which is a modification of frequency detector 100.

In a configuration of frequency detector 101 in FIG. 4, flip-flop circuits 4 and 5 are added to frequency detector 100 in FIG. 1. Flip-flop circuits 4 and 5 are connected respectively to flip-flop circuits 1 and 2 as preceding stages. Similarly to flip-flop circuits 1 and 2, flip-flop circuits 4 and 5 operate in synchronization only with the rising edge of data signal data.

As described above, through the connection of flip-flop circuits 4 and 5 to flip-flop circuits 1 and 2 as the preceding stages, clock signals iclk and qclk input to flip-flop circuits 1 and 2 are stabilized with respect to a cycle of data signal data. Therefore, frequency detector 101 can prevent a metastable state in addition to an erroneous determination caused by a corrupted duty ratio.

Second Embodiment

Figure 5:
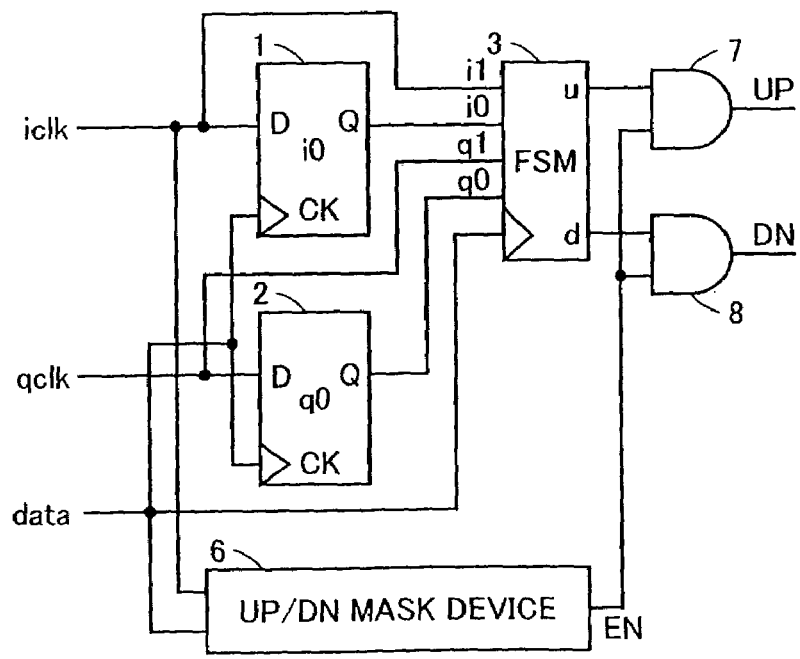
FIG. 5 is a block diagram illustrating a configuration of a frequency detector 200 in accordance with a second embodiment of the present invention.

FIG. 5 is a block diagram illustrating a configuration of a frequency detector 200 in accordance with a second embodiment of the present invention.

In a configuration of frequency detector 200 in FIG. 5 in accordance with the second embodiment, an UP/DN mask device 6 and AND gates 7 and 8 are added to frequency detector 100 in FIG. 1 in accordance with the first embodiment.

UP/DN mask device 6 receives inputs of clock signal iclk and data signal data, and outputs an enable signal EN when the data signal successively has the same value. It is noted that clock signal iclk input to UP/DN mask device 6 may be clock signal qclk.

Output signal u from FSM 3 and enable signal EN are input to AND gate 7, while output signal d from FSM 3 and enable signal EN are input to AND gate 8. Through the function of AND gates 7 and 8, only when enable signal EN is at an H level, output signals u and d of the H level from FSM 3 are output as up signal UP and down signal DN of the H level, respectively.

As described above, through the addition of UP/DN mask device 6 and AND gates 7 and 8 to frequency detector 100, it is possible to prevent the erroneous determination caused by the data signal successively having the same value in addition to the erroneous determination caused by the corrupted duty ratio of the data signal. How the erroneous determination is caused by the identical value in succession will be described hereinafter with reference to a specific configuration of UP/DN mask device 6.

Figure 6:
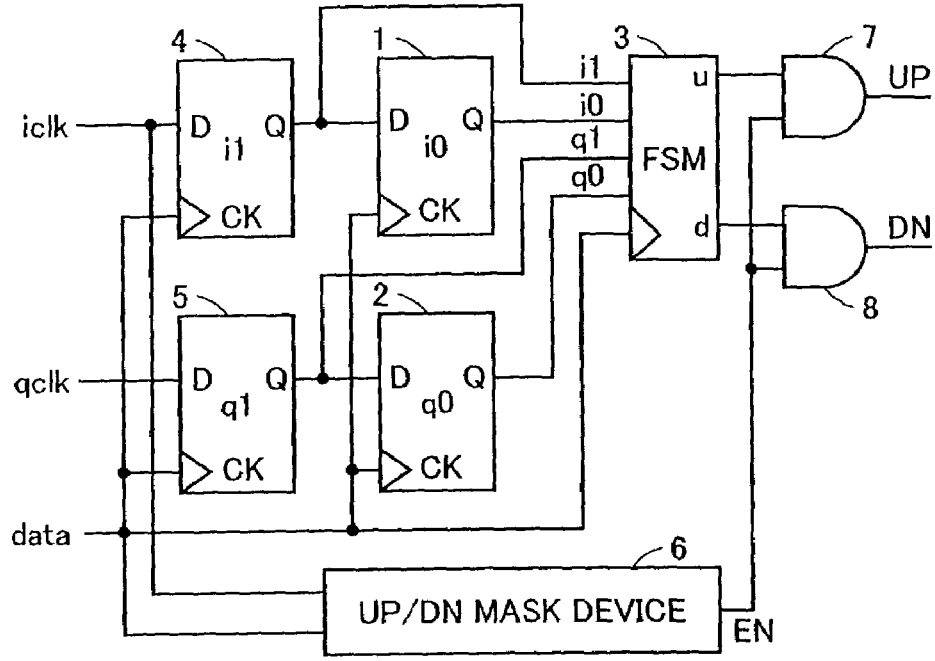
FIG. 6 is a block diagram illustrating a configuration of a frequency detector 201 which is a modification of frequency detector 200.

FIG. 6 is a block diagram illustrating a configuration of a frequency detector 201 which is a modification of frequency detector 200.

In a configuration of frequency detector 201 in FIG. 6, flip-flop circuits 4 and 5 are added to frequency detector 200 in FIG. 5. Through the connection of flip-flop circuits 4 and 5 to flip-flop circuits 1 and 2 as the preceding stages as described above, frequency detector 201 can prevent a metastable state in addition to the erroneous determination caused by the corrupted duty ratio and the identical value in succession.

In the following, several examples of specific configurations of UP/DN mask device 6 will be described.

Figure 7:
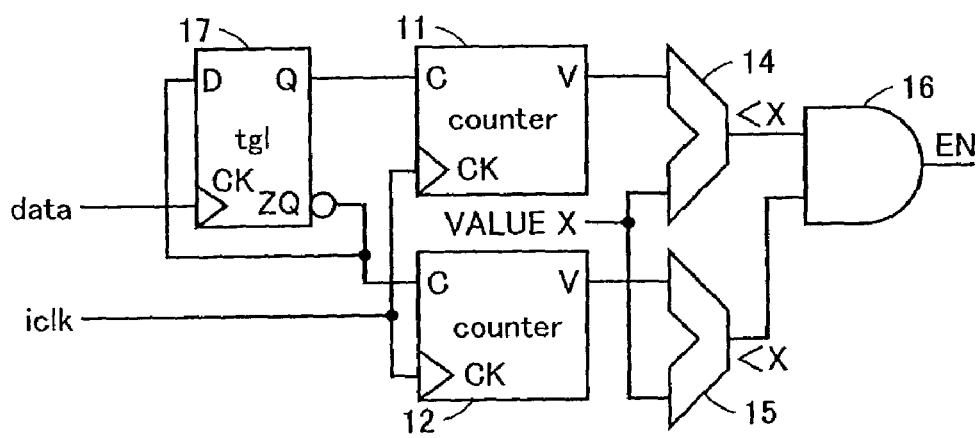

FIG. 7 is a block diagram illustrating a configuration of an UP/DN mask device 6a.

UP/DN mask device 6a in FIG. 7 includes counters 11, 12, comparators 14, 15, an AND gate 16, and a toggle device 17.

Counters 11 and 12 both include C input terminals, CK input terminals, and V output terminals. When a signal input from C input terminal is at the L level, a count output from V output terminal is always zero. On the other hand, when the signal input from C input terminal is at the H level, every time a signal input from CK input terminal rises, 1 is added to the count output from V output terminal. Any value is not added to the count output from V output terminal, when the count value reaches a prescribed limit value E.

Toggle device 17 is a data flip-flop circuit synchronizing only with the rising edge of data signal data. Toggle device 17 has a ZQ output terminal, which is the inversion of a Q output, connected to a D input terminal. Toggle device 17 inverts an output of the Q output terminal every time data signal data rises.

An output signal from Q output terminal of toggle device 17 and an output signal from ZQ output terminal of toggle device 17 are input to C input terminals of counters 11 and 12, respectively. Clock signal iclk is input to both CK input terminals of counters 11 and 12. Count values output from V output terminals of counters 11 and 12 are input to comparators 14 and 15, respectively.

When the input count value is smaller than a prescribed set value X, comparators 14 and 15 output signals at the H level. When the count value output from counter 11 is smaller than this set value X, the signal output from comparator 14 is at the H level. Likewise, when the count value output from counter 12 is smaller than this set value X, the signal output from comparator 15 is at the H level. When the signals output from comapartors 14 and 15 are both at the H level, enable signal EN output from AND gate 16 is at the H level.

It is noted that the above-described set value X is determined based on a waveform quality of data signal data. In addition, set value X is smaller than the above-mentioned limit value E. Here, it is assumed that X is 3 (X=3).

Figure 8:
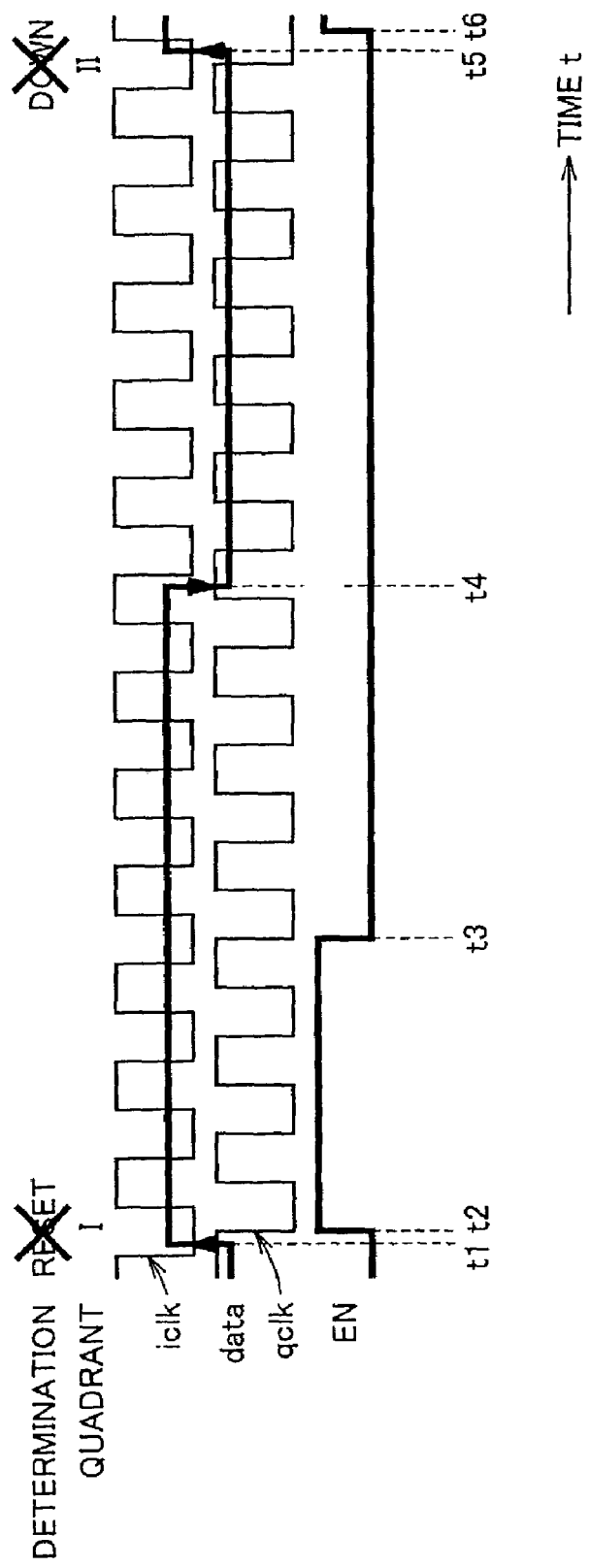
FIG. 8 is a timing diagram representing an operation of UP/DN mask device 6a in FIG. 7.

FIG. 8 is a timing diagram representing an operation of UP/DN mask device 6a in FIG. 7.

At time t1, data signal data rises, and a comparison test on a frequency difference between the data signal and the clock signal is initiated. This comparison test is performed in FSM 3 under the procedure described in FIG. 3.

Upon the rise of data signal data, counter 11 initiates a new count, whereas the count output of counter 12 is zero. Then, the count values output from counters 11 and 12 are smaller than set value X. Accordingly, the signals output from comparators 14 and 15 both have the H level. As a result, at time t2, enable signal EN output from AND gate 16 attains the H level.

Since enable signal EN is at the L level at time t1, however, outputs (u, d) from FSM 3 are not transmitted. Accordingly, both up signal UP and down signal DN are always at the L level. That is, a result of the comparison test on the frequency difference at time t1 is not output in the end. Not illustrated in FIG. 8, enable signal EN has been at the L level before time t1. This means that data signal data has been of the same value successively before time t1.

At time t3, the output count number of counter 11 reaches set value X=3. Then, the output from comparator 14 is pulled down to the L level, and enable signal EN output from the AND gate returns to the L level. Counter 11 increases the output count number by 1 every time clock signal iclk rises, until the output count number reaches limit value E.

At time t4, data signal data falls. Since FSM 3 in accordance with the present invention operates in synchronization only with the rising edge of data signal data, a comparison test on a frequency difference between the data signal and the clock signal is not performed at this time.

At time t5, data signal data rises. Then, a comparison test on a frequency difference between the data signal and the clock signal is initiated again. Through the rise of data signal data, enable signal EN output from AND gate 16 is raised to the H level at time t6.

Since enable signal EN is at the L level at time t5, however, outputs (u, d) from FSM 3 are not transmitted. Accordingly, both up signal UP and down signal DN are always at the L level. That is, a result of the comparison test on the frequency difference at time t5 is not output in the end.

As described above, the result of the comparison test on the frequency difference is not output immediately after the rise of enable signal EN. This can prevent the erroneous determination caused by identical data-signal values in succession in frequency detectors 200 and 201.

When UP/DN mask device 6a is utilized, an output phase from AND gate 16 may not match a latency of FSM 3. A configuration of an UP/DN mask device for solving this problem will be described hereinafter.

Figure 9:
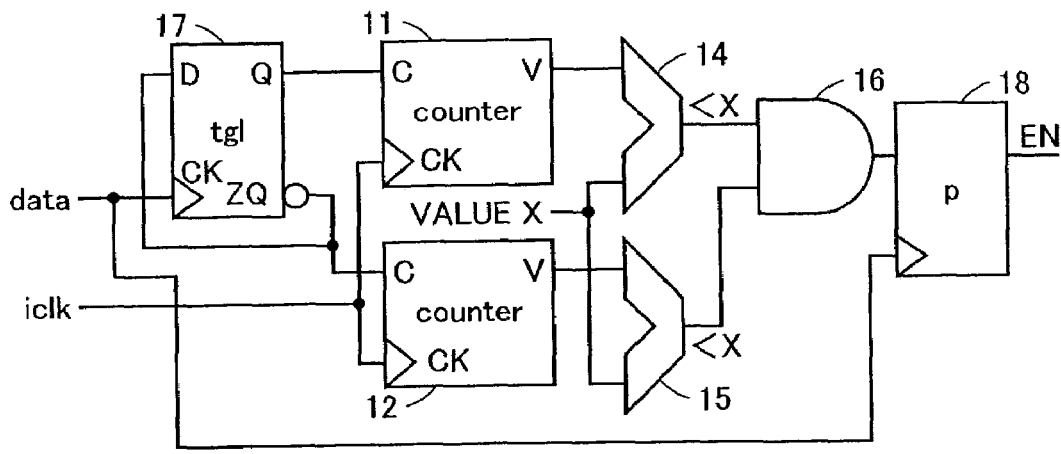
FIG. 9 is a block diagram illustrating a configuration of an UP/DN mask device 6b.

FIG. 9 is a block diagram illustrating a configuration of an UP/DN mask device 6b.

In the configuration of UP/DN mask device 6b in FIG. 9, a phase shifter 18 is added to UP/DN mask device 6a in FIG. 7. Phase shifter 18 adjusts and outputs a phase of an input signal. Phase shifter 18 is connected to AND gate 16 as a succeeding stage.

As described above, through the connection of phase shifter 18 to AND gate 16 as the succeeding stage, phase shifter 18 can adjust an output phase from AND gate 16. As a result, the output phase from AND gate 16 can match a latency of FSM 3. Furthermore, phase shifter 18 can also adjust a variation in output phase caused by flip-flop circuits 4 and 5 added in frequency detector 201.

UP/DN mask device 6 in accordance with the present invention is also applicable to a conventional frequency detector sampling a clock signal by using both rising and falling edges of a data signal. In the following, a description will be given about a configuration of an UP/DN mask device applicable to the FD described in FIG. 20.5.1 in WA 20.5, which is an example of such a conventional frequency detector.

Figure 10:
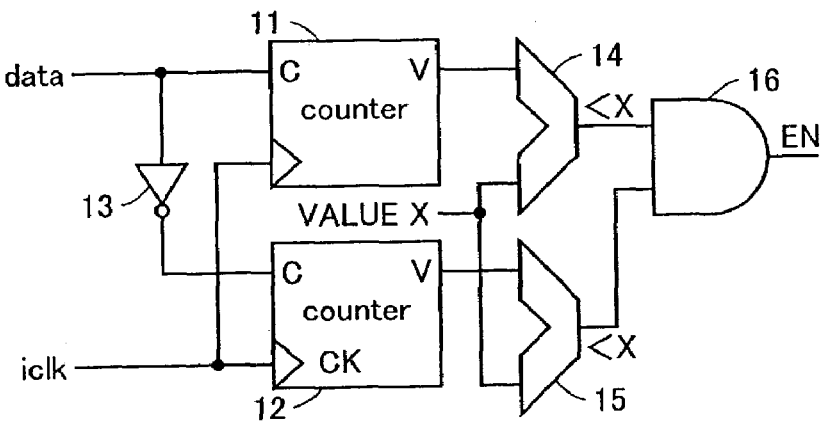
FIG. 10 is a block diagram illustrating a configuration of an UP/DN mask device 6c.

FIG. 10 is a block diagram illustrating a configuration of an UP/DN mask device 6c.

UP/DN mask device 6c in FIG. 10 includes counters 11, 12, an inverter 13, comparators 14, 15, and AND gate 16.

Data signal data and an inversion signal of data signal data from inverter 13 are input to C input terminals of counters 11 and 12, respectively. Clock signal iclk is input to both CK input terminals of counters 11 and 12. Count values output from V output terminals of counters 11 and 12 are input to comparators 14 and 15, respectively.

When the input count value is smaller than a prescribed set value X, comparators 14 and 15 output signals at the H level. When the count value output from counter 11 is smaller than this set value X, the signal output from comparator 14 is at the H level. Likewise, when the count value output from counter 12 is smaller than this set value X, the signal output from comparator 15 is at the H level. When the signals output from comapartors 14 and 15 are both at the H level, enable signal EN output from AND gate 16 is at the H level.

Figure 11:
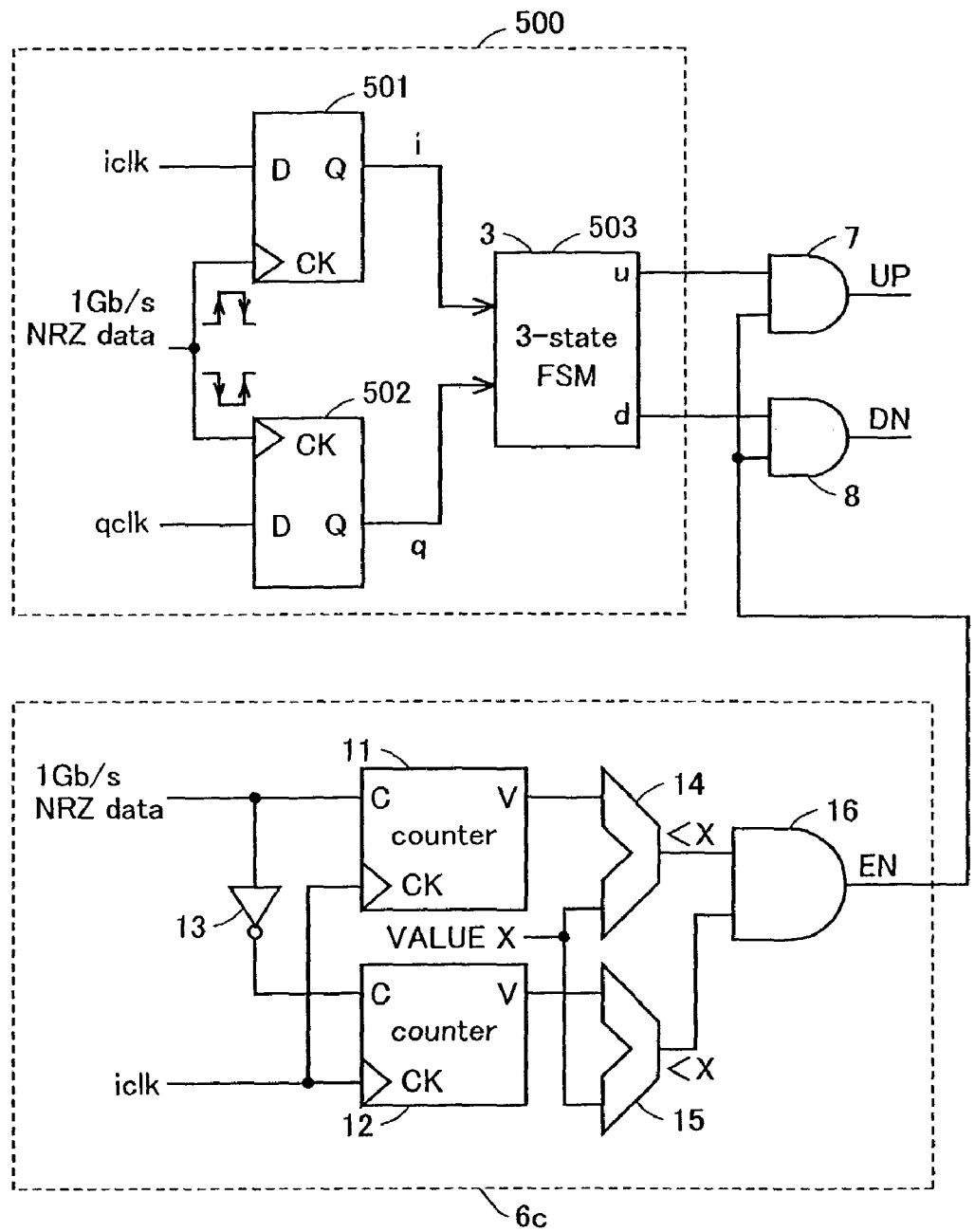
FIG. 11 is a block diagram illustrating how UP/DN mask device 6c shown in FIG. 10 is connected to an FD 500.

FIG. 11 is a block diagram illustrating how UP/DN mask device 6c shown in FIG. 10 is connected to an FD 500.

FD 500 in FIG. 11 is the FD described in FIG. 20.5.1 in WA 20.5. Flip-flop circuits 501, 502, and FSM 503 in FD 500 respectively correspond to, for example, flip-flop circuits 1, 2, and FSM 3 in FIG. 5. Output signal u from FSM 503 and enable signal EN are input to AND gate 7. Output signal d from FSM 503 and enable signal EN are input to AND gate 8. It is noted that flip-flop circuits 501, 502, and FSM 503 operate in synchronization with both rising and falling edges of data signal data.

Similarly to frequency detectors 200 and 201, through the function of AND gates 7 and 8, only when enable signal EN is at the H level, output signals u and d of the H level from FSM 503 are output as up signal UP and down signal DN of the H level, respectively. Here, an NRZ (Non Return to Zero) data signal of 1 Gb/s is employed as data signal data.

Figure 12:
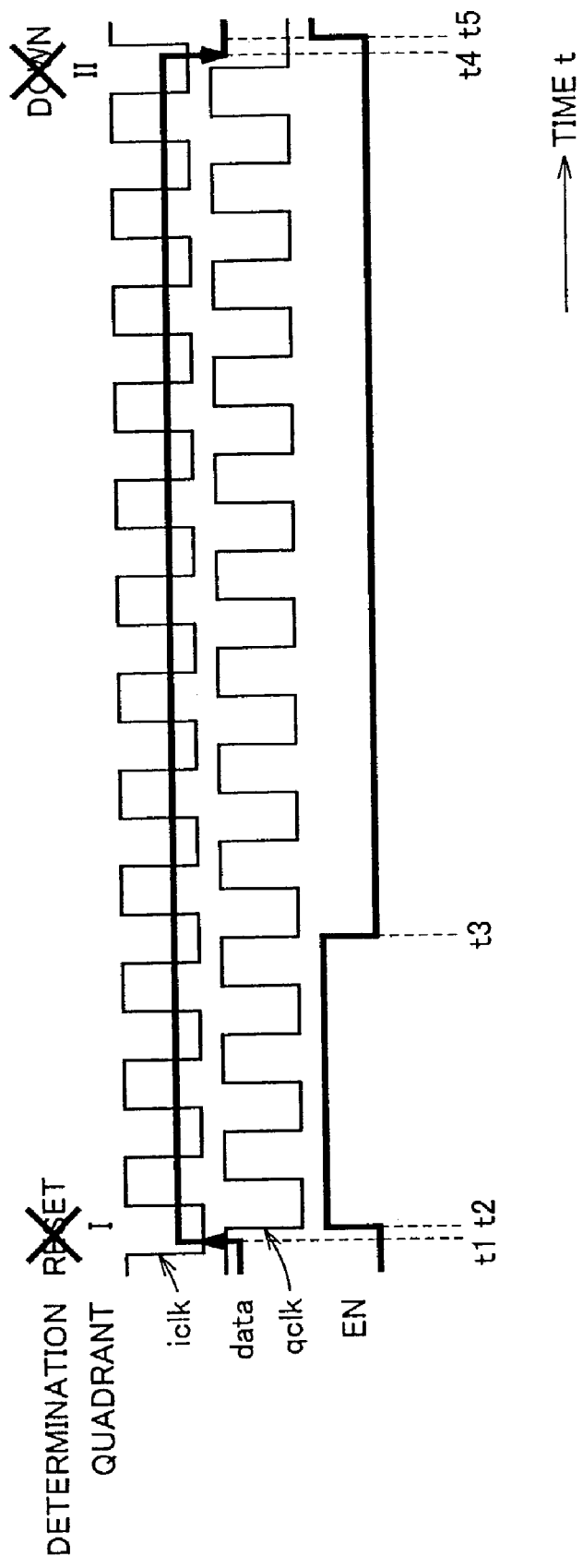
FIG. 12 is a timing diagram representing an operation of UP/DN mask device 6c in FIG. 10.

FIG. 12 is a timing diagram representing an operation of UP/DN mask device 6c shown in FIG. 10.

At time t1, data signal data rises, and a comparison test on a frequency difference between the data signal and the clock signal is initiated. This comparison test is performed in FSM 503 under the procedure similar to that described in connection with FIG. 3.

Upon the rise of data signal data, counter 11 initiates a new count, whereas a count output of counter 12 is zero. Then, both count values output from counters 11 and 12 are smaller than set value X. Accordingly, both signals output from comparators 14 and 15 have the H level. As a result, at time t2, enable signal EN output from AND gate 16 attains the H level.

Since enable signal EN is at the L level at time t1, however, outputs (u, d) from FSM 503 are not transmitted. Accordingly, both up signal UP and down signal DN are always at the L level. That is, a result of the comparison test on the frequency difference at time t1 is not output in the end. Not illustrated in FIG. 12, enable signal EN has been at the L level before time t1. This means that data signal data has been of the same value successively before time t1.

At time t3, the output count number of counter 11 reaches set value X=3. Then, the output from comparator 14 is pulled down to the L level, and enable signal EN output from the AND gate returns to the L level. Counter 11 increases the output count number by 1 every time clock signal iclk rises, until the output count number reaches limit value E.

At time t4, data signal data falls. Then, a comparison test on the frequency difference between the data signal and the clock signal is initiated again. This comparison test is performed in FSM 503 described in WA 20.5. Therefore, the comparison test is performed even on the falling edge of data signal data, which is different from the cases in which the above-described frequency detectors in accordance with the present invention are utilized.

Upon the fall of data signal data, counter 12 initiates a new count this time, whereas the count output of counter 11 is zero. Then, both count values output from counters 11 and 12 are smaller than set value X. As a result, at time t5, enable signal EN output from AND gate 16 attains the H level again.

Since enable signal EN is at the L level at time t4, however, outputs (u, d) from FSM 503 are not transmitted. Accordingly, a result of the comparison test on the frequency difference is not eventually output at time t4 as well.

As described above, the result of the comparison test on the frequency difference is not output immediately after the change in enable signal EN. This can prevent the erroneous determination caused by identical data-signal value in succession in the FD in WA 20.5 as well.

The flip-flop circuits in accordance with the first and second embodiments, except flip-flop circuits 501 and 502 in WA 20.5 as shown in FIG. 11, operate on the rising edge only. However, they may also operate on the falling edge only.

Instead of data signal data, clock signal clk different from clock signals iclk and qclk may be employed. In this case, a comparison test may be performed for a frequency difference between clock signal clk and clock signals iclk, qclk.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A frequency detector for detecting a variation in frequency difference between a data signal and a clock signal, comprising:
    a first flip-flop circuit for receiving said clock signal in synchronization only with either a rising edge or a falling edge of said data signal;
    a second flip-flop circuit for receiving a second clock signal 90 degrees out of phase with said clock signal in synchronization with said first flip-flop circuit; and
    a frequency difference detection unit for detecting a variation in frequency difference between said data signal and said clock signal based on said clock signal, said second clock signal, and data held by said first and second flip-flop circuits, and providing outputs of first and second control signals indicating an increase or a decrease in frequency of said clock signal depending on a result of said detection.

2. The frequency detector according to claim 1, further comprising:
    a third flip-flop circuit connected to said first flip-flop circuit as a preceding stage for receiving said clock signal in synchronization with said first flip-flop circuit; and
    a fourth flip-flop circuit connected to said second flip-flop circuit as a preceding stage for receiving said second clock signal in synchronization with said first flip-flop circuit.

3. The frequency detector according to claim 1, further comprising:
a successive identical value detection unit for providing an output of an inhibit signal when said data signal has an identical value repeated at least a prescribed number of times;
a first AND gate for receiving inputs of said first control signal and said inhibit signal; and
a second AND gate for receiving inputs of said second control signal and said inhibit signal.

4. The frequency detector according to claim 3, wherein said successive identical value detection unit includes
an inversion control circuit for inverting an output signal in synchronization with said first flip-flop circuit,
a first counter circuit for counting how many times either said clock signal or said second clock signal has risen or fallen in a period between an output inversion by said inversion control circuit and a next output inversion,
a second counter circuit for counting, complementarily to said first counter circuit, how many times either said clock signal or said second clock signal has risen or fallen in a period between an output inversion by said output inversion control circuit and a next output inversion,
a first comparator for comparing a first count value of said first counter circuit with a first set value and providing an output of a third control signal if said first count value is smaller than said first set value,
a second comparator for comparing a second count value of said second counter circuit with a second set value and providing an output of a fourth control signal if said second count value is smaller than said second set value, and
a third AND gate for receiving inputs of said third and fourth control signals and providing an output of said inhibit signal.

5. The frequency detector according to claim 4, further comprising a phase shifter for adjusting a phase of said inhibit signal.

6. A frequency detector for detecting a variation in frequency difference between a data signal and a clock signal, comprising:
a first flip-flop circuit for receiving said clock signal in synchronization with a rising edge and a falling edge of said data signal;
a second flip-flop circuit for receiving a second clock signal 90 degrees out of phase with said clock signal in synchronization with said first flip-flop circuit;
a frequency difference detection unit for detecting a variation in frequency difference between said data signal and said clock signal based on said clock signal, said second clock signal, and data held by said first and second flip-flop circuits, and providing outputs of first and second control signals indicating an increase or a decrease in frequency of said clock signal depending on a result of said detection;
a successive identical value detection unit for providing an output of an inhibit signal when said data signal has an identical value repeated at least a prescribed number of times;
a first AND gate for receiving inputs of said first control signal and said inhibit signal; and
a second AND gate for receiving inputs of said second control signal and said inhibit signal.

7. The frequency detector according to claim 6, further comprising:
a third flip-flop circuit connected to said first flip-flop circuit as a preceding stage for receiving said clock signal in synchronization with said first flip-flop circuit; and
a fourth flip-flop circuit connected to said second flip-flop circuit as a preceding stage for receiving said clock signal in synchronization with said first flip-flop circuit.

8. The frequency detector according to claim 6, wherein said successive identical value detection unit includes
a first counter circuit for counting how many times either said clock signal or said second clock signal has risen or fallen in a period between a rise of said data signal and a fall of said data signal,
a second counter circuit for counting, complementarily to said first counter circuit, how many times either said clock signal or said second clock signal has risen or fallen in a period between a rise of said data signal and a fall of said data signal,
a first comparator for comparing a first count value of said first counter circuit with a first set value and providing an output of a third control signal if said first count value is smaller than said first set value,
a second comparator for comparing a second count value of said second counter circuit with a second set value and providing an output of a fourth control signal if said second count value is smaller than said second set value, and
a third AND gate for receiving inputs of said third and fourth control signals and providing an output of said inhibit signal.

9. The frequency detector according to claim 8, further comprising a phase shifter for adjusting a phase of said inhibit signal.

10. The frequency detector according to claim 1, wherein said frequency difference detection unit detects the variation in frequency difference between said data signal and said clock signal in synchronization only with either the rising edge or the falling edge of said data signal.

* * * * *

UNITED STATES PATENT AND TRADEMARK OFFICE
CERTIFICATE OF CORRECTION

PATENT NO. : 6,960,960 B2
APPLICATION NO. : 10/442987
DATED : November 1, 2005
INVENTOR(S) : Masahiko Ishiwaki It is certified that error appears in the above-identified patent and that said Letters Patent is hereby corrected as shown below:

On the title page of the Letters Patent,

Under section "(73) Assignee:", change " Renesas Technology Corp., Tokyo, JAPAN " to -- Mitsubishi Denki Kabushiki Kaisha, Tokyo, JAPAN --

Signed and Sealed this

Twentieth Day of March, 2007

JON W. DUDAS
*Director of the United States Patent and Trademark Office*